United States Patent [19]

Mercy

[11] Patent Number: 4,488,259
[45] Date of Patent: Dec. 11, 1984

[54] ON CHIP MONITOR

[75] Inventor: Brian R. Mercy, Warrenton, Va.

[73] Assignee: IBM Corporation, Armonk, N.Y.

[21] Appl. No.: 437,775

[22] Filed: Oct. 29, 1982

[51] Int. Cl.³ .............................................. G06F 1/00
[52] U.S. Cl. .................................................. 364/900
[58] Field of Search ... 364/200 MS File, 900 MS File, 364/716, 715; 307/272 R; 324/73 R

[56] References Cited

U.S. PATENT DOCUMENTS

| | | | |
|---|---|---|---|
| 3,614,327 | 10/1971 | Low et al. | |
| 3,631,402 | 12/1971 | Field | |
| 3,868,646 | 2/1975 | Bergman | |
| 3,935,476 | 1/1976 | Paluck | |
| 4,071,902 | 1/1978 | Eichelberger et al. | 364/900 X |
| 4,277,699 | 7/1981 | Brown et al. | 307/272 R |
| 4,293,919 | 10/1981 | Dasgupta et al. | 364/716 |
| 4,298,980 | 11/1981 | Hajdu et al. | 364/900 X |
| 4,312,066 | 1/1982 | Bantz et al. | 364/200 X |
| 4,428,060 | 1/1984 | Blum | 364/715 |
| 4,441,075 | 4/1984 | McMahon | 324/73 R |

Primary Examiner—Raulfe B. Zache
Attorney, Agent, or Firm—John E. Hoel

[57] ABSTRACT

Level sensitive scan design (LSSD) scan strings on an integrated digital logic circuit chip are employed for multiple functions of providing control parameters to logic blocks on the integrated circuit chip, and for providing reconfiguration messages to reconfiguration logic on the integrated circuit chip, in addition to the normal function of transferring test data to various portions of the integrated circuit chip. This reduces the number of input/output pads on the integrated circuit chip which must be dedicated to these functions.

10 Claims, 11 Drawing Figures

CHIP ORGANIZATION

MONITOR

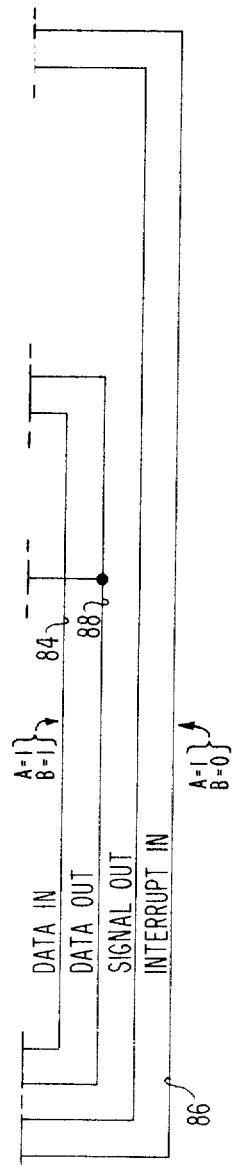

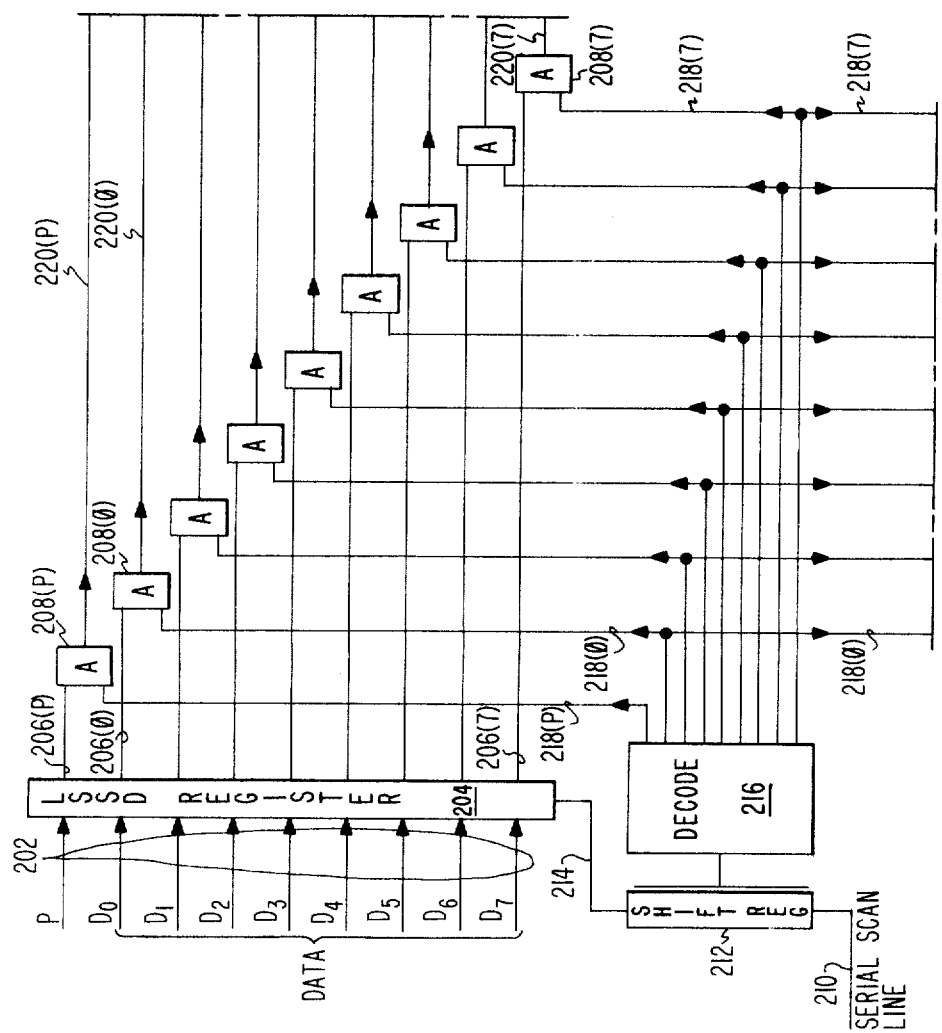

ON CHIP MONITOR

FIELD OF THE INVENTION

The invention disclosed broadly relates to LSSD logic systems for use in digital computers and more particularly relates to logic for making multiple use of the LSSD scan strings on an integrated circuit chip.

BACKGROUND OF THE INVENTION

In its most elementary form, level sensitive scan design principles involve the use of a dedicated serial data path from an input pad to the serial inputs of concatenated LSSD shift registers for the purpose of scanning in test data which is then output during a testing interval to embedded logic on the integrated circuit chip to be tested. During the testing interval, the embedded logic processes the test data input from the LSSD scan string and outputs the result of that logical processing to an output LSSD shift register associated with the embedded logic. That output LSSD shift register then serially outputs the test result data to the same or to another LSSD scan string, which result data is serially output from the chip for test result analysis. These principles are described in greater detail in many of the following related patents:

U.S. Pat. No. 3,761,695 entitled "Method of Level Sensitive Testing a Functional Logic System," to Edward B. Eichelberger and of common assignee.

U.S. Pat. No. 3,783,254 entitled "Level Sensitive Logic System," to Edward B. Eichelberger and of common assignee.

U.S. Pat. No. 3,806,891 entitled "Logic Circuit for Scan-In/Scan-Out," to Edward B. Eichelberger, Richard N. Gustafson and Clark Kurtz, and of common assignee.

U.S. Pat. No. 4,071,902 entitled "Reduced Overhead for Clock Testing in a Level System Scan Design (LSD) System," to Edward B. Eichelberger and Thomas W. Williams and assigned to the common assignee.

OBJECTS OF THE INVENTION

It is an object of the invention to make multiple usage of level sensitive scan design strings on an integrated circuit chip.

It is still another object of the invention to reconfigure the logic paths on an integrated circuit logic chip in response to detected parity errors, in an improved manner.

It is still a further object of the invention to reconfigure the logic paths on an integrated circuit logic chip in response to detected parity errors, in an improved manner by means of making multiple use of level sensitive scan design strings on the integrated circuit chip.

It is still a further object of the invention to provide control parameters to logic blocks on an integrated circuit logic chip by means of level sensitive scan design strings during intervals when testing is not being conducted.

SUMMARY OF THE INVENTION

These and other objects, features and advantages of the invention are accomplished by the on chip monitor invention disclosed herein. Level sensitive scan design (LSSD) scan strings on an integrated digital logic circuit chip are employed for multiple functions of providing control parameters to logic blocks on the integrated circuit chip, and for providing reconfiguration messages to reconfiguration logic on the integrated circuit chip, in addition to the normal function of transferring test data to various portions of the integrated circuit chip. This reduces the number of input/output pads on the integrated circuit chip which must be dedicated to these functions.

DESCRIPTION OF THE FIGURES

These and other objects, features and advantages of the invention will be more fully appreciated with reference to the accompanying figures.

FIG. 3 and 3a, 3b and 3c are a still more detailed functional block diagram of the monitor circuit portion of the invention.

FIG. 4 and 4a, 4b, 4c, and 4d are a detailed logic diagram of the interface portion of the invention.

DISCUSSION OF THE PREFERRED EMBODIMENT

Level sensitive scan design (LSSD) scan strings on an integrated digital logic circuit chip are employed for multiple functions of providing control parameters to logic blocks on the integrated circuit chip, and for providing reconfiguration messages to reconfiguration logic on the integrated circuit chip, in addition to the normal function of transferring test data to various portions of the integrated circuit chip. This reduces the number of input/output pads on the integrated circuit chip which must be dedicated to these functions.

Figure 1:
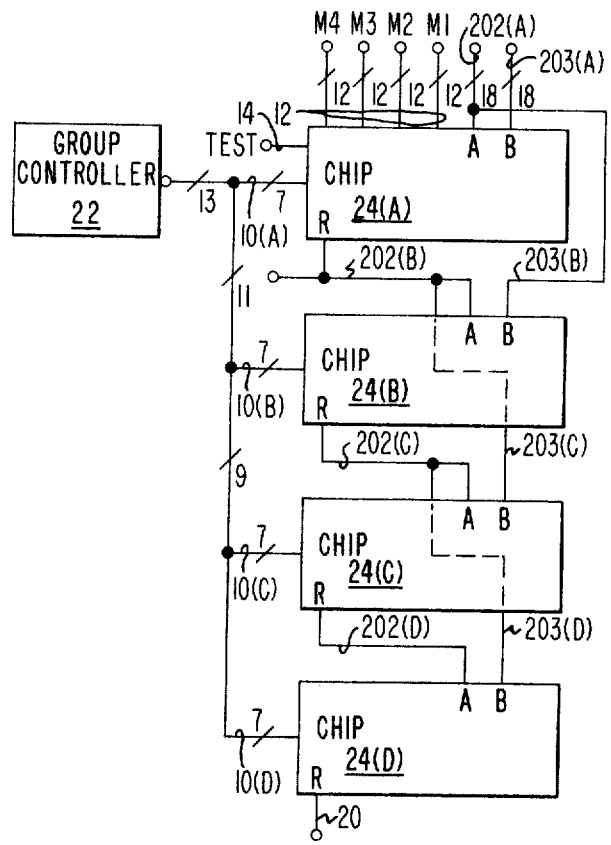
FIG. 1 is a functional block diagram of the interconnection of a plurality of integrated digital logic circuit chips, each chip employing the on chip monitor invention.

FIG. 1 shows a multi-chip system block diagram configuration in which the invention finds application. Four digital logic integrated circuit chips 24A through 24D are connected in cascade fashion for an array processing application. For example, if a 16-point fast Fourier transform were to be performed on data input at the input line 202A, the first chip 24A would carry out the first two-point butterfly computation, the results of which would be output on line 202B to the input of the next chip 24B. The chip 24B would then carry out the second two-point butterfly computation the results of which would be output on line 202C to chip 24C. Chip 24C would then carry out the third two-point butterfly computation and output the results on line 202D to the last chip 24D. Chip 24D would carry out the fourth two-point butterfly computation, outputting the results on line 20. It is seen that in order to successfully carry out a 16-point butterfly computation, some coordinated control must be exercised over the arithmetic operations carried out by the chips and each chip must reliably perform its operations since the results of the 16-point butterfly computation depends upon the successful operation of each respective chip.

The group controller 22 is a programmed microprocessor having a control bus 10A–10D connected to each of the digital logic integrated circuit chips 24A through 24D by means of the respective inputs 10A through 10D from the bus 10. The bus 10 will pass control information between the group controller 22 and the chips 24A–24D to carry out the necessary arithmetic control functions to coordinate the arithmetic operations of the interdependent chips. The bus 10 will also pass testing information between the group controller 22 and the chips 24A-24D to carry out operational tests employing level sensitive scan design techniques (LSSD) during selected testing intervals. When, in response to such tests, a failure condition is indicated involving a particular one of the chips 24A-24D, reconfiguration information can be transmitted from the group controller 22 over the bus 10 to the failing chip to control the reconfiguration of the failing chip so that it can operate in a degraded mode to enable the successful production of the desired result, for example the successful completion of the 16-point butterfly computation, described above.

Other lines connected to the chips shown in FIG. 1 include the memory buses M1 through M4, some of which can also serve as input/output buses to peripheral devices such as analog-to-digital converters, for example. An auxiliary data input line 203A-D can also be employed for selectively routing data around a chip which has failed to the point that it cannot be operated in a degraded mode. An auxiliary test input line 14 can be employed to enable specialized testing of the chips 24A-24D during manufacture.

Figure 2:
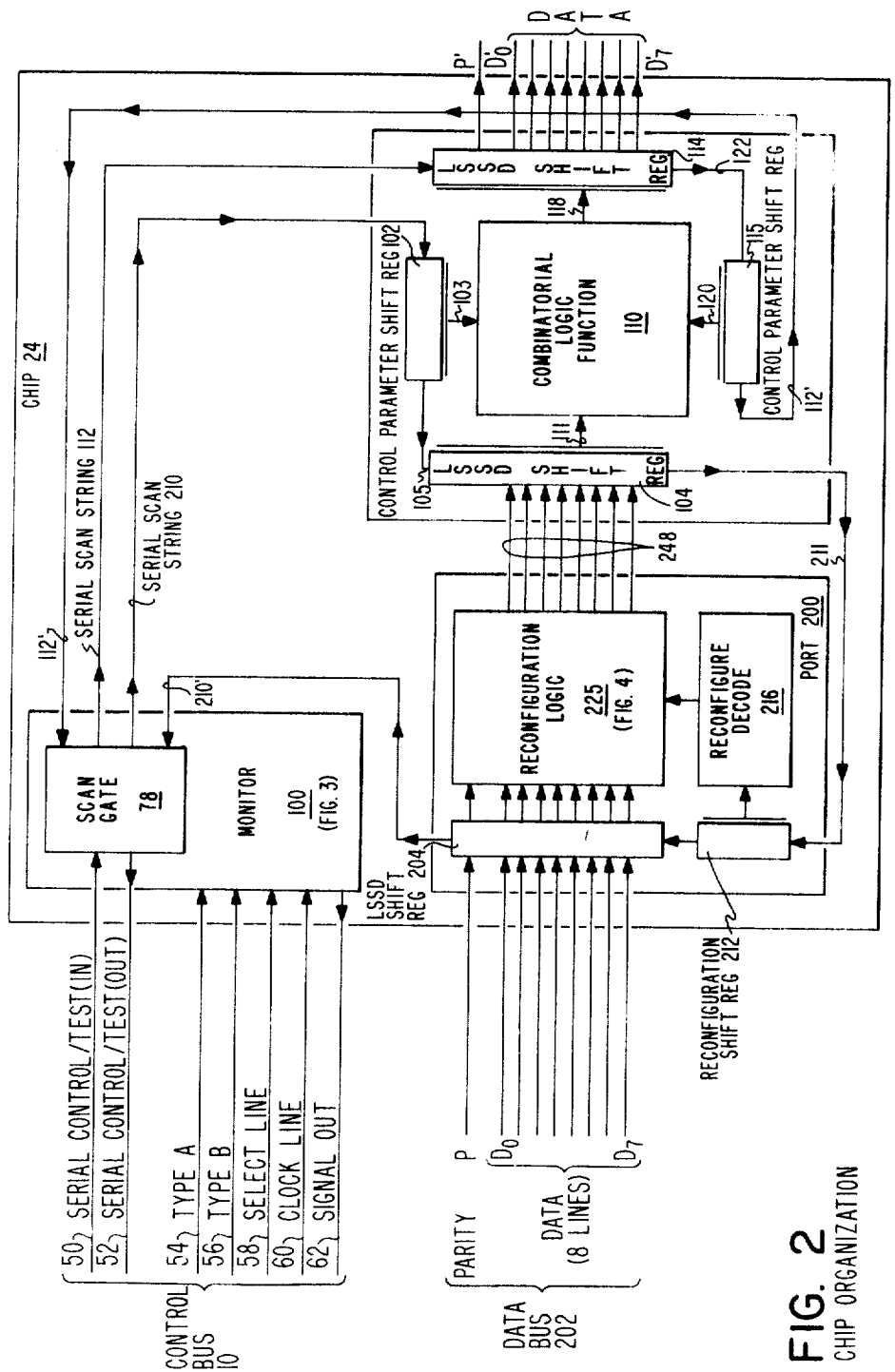
FIG. 2 is a more detailed functional block diagram of an integrated digital logic circuit chip emloying the on chip monitor invention.

FIG. 2 illustrates a more detailed view of a single one of the chips 24A-24D, hereinafter designated as chip 24. The control bus 10 is composed of seven digital lines, the serial control/test input line 50, the serial control/test output line 52, the type A line 54, the type B line 56, the select line 58, the clock line 60, and the signal out line 62. These lines connect the bus 10 to the monitor 100 on the chip 24, which is shown in greater detail in FIG. 3. The monitor circuit 100 serves as the control interface for the chip 24 with respect to the bus 10, and interconnects with a variety of control and arithmetic logic on the chip 24. The data bus 202A-D will be referred to hereinafter as the data bus 202 for the generalized chip 24 of FIG. 2. The data bus 202 consists of eight data lines D0 through D7 and the parity line P. In the application described herein, an odd parity rule is applied so that the total number of binary ones input by the data bus 202 must always be odd, the parity line P assuming a binary zero or a one state in order to comply with this odd parity rule. Whenever the data input on the data bus 202 is detected to have an even parity where the nine lines have an even number of binary ones therein, it is assumed that a single error has occurred on one of the eight data lines D0 through D7. Reconfiguration logic 225 on the chip 24 will respond from a command sent from the group controller 22 as shown in FIG. 1, to reconfigure the data lines D0 through D7 and the parity line P so that eight binary bits of valid information will be output on lines 248 to the combinatorial logic functions on the chip 24. Operating under this condition, the chip can no longer benefit from the indication of parity errors on the P line and this mode of operation will be described as the degraded mode of operation. The reconfiguration message which controls the reconfiguration logic 225 is received over the bus 10 from the group controller 22 by the monitor 100. This serial-by-bit data input on line 50 is passed through the scan gate 78 to the serial scan string 210 which will convey the reconfiguration message to the reconfiguration shift register 212. The reconfiguration decoder 216, in response to the reconfiguration message in the shift register 212, will control the reconfiguration logic 225 to modify the pathways for the parity line P and the one failing data input line among the plurality of input lines D0-D7. This operation is described in conjunction with the description of FIG. 4 hereinafter. The reconfiguration logic 225 and the reconfiguration decoder 216 comprise a part of the interface port 200.

Periodically, tests will be conducted of the functional operability of the combinatorial logic circuits 110 on the chip 24 to insure their proper operation. This is performed using the principles of level sensitive scan design wherein, during the testing interval, test patterns are input in a serial-by-bit manner on the line 50 to the scan gate 78 of the monitor 100. This serial test pattern is output over the serial scan string 210, for example, to the LSSD shift register 104. The test pattern bits are then output in parallel over line 111 to the input of the combinatorial logic function 110 and a single cycle of arithmetic operation is carried out. The result of that arithmetic operation is output from the logic function 110 on the line 118 to the parallel input of the LSSD shift register 114. Then, the result data bits are serially output over line 122 to the serial scan string 112' back to the scan gate 78. The test result bits are then serially output over the serial control/test output line 52 to the group controller 22 where a test result analysis can be conducted. Array processing arithmetic operations are typically highly repetitive sequences of elementary arithmetic operations which are performed on large data sets. Such highly repetitive arithmetic operations undergo far fewer branches and interrupts than occur with general purpose computers. This enables the simultaneous execution of sequential portions of the arithmetic operations employing pipelining techniques well-known to the art. This enables a limited repertoire of instruction sets to be made available to the arithmetic logic on a particular integrated circuit chip 24, making it unnecessary to engage in frequent accessing of new instruction sets from an instruction storage device. This enables the use of control parameters which designate which of the limited number of instruction sets are to be executed for a particular array processing arithmetic operation. In accordance with the invention, the serial-by-bit level sensitive scan design strings are employed to convey control parameters to the combinatorial logic function blocks on the integrated circuit chip 24 during control setup intervals. During a particular control setup interval, a control parameter message is input in a serial-by-bit manner on line 50 to the scan gate 78 in the monitor 100. The control parameter message is then output on the serial scan string 210, for example, to the serial input of the control parameter shift register 102. The control parameter bits are then output in parallel over line 103 to a control input to the combinatorial logic function 110 on the chip 24. Additional scan strings, such as 112, can connect additional LSSD shift registers, such as 114, and additional control parameter registers, such as 115, to the scan gate 78. The scan gate 78 can selectively connect the scan string 112-112' to the lines 52 and 50. In this manner, efficient usage can be made of the input/output pads on the integrated circuit chip and the serial scan strings on the integrated circuit chip to enable the combined use of the serial scan strings for a level sensitive scan design testing, for reconfiguration of failing data paths, and for the conveyance of control parameters to combinatorial logic functions on the integrated circuit chip 24.

A typical integrated digital logic circuit chip 24 can contain as many as 50,000 gates thereon requiring on the order of 1,000 LSSD latches to enable sufficient functional isolation and sufficiently short scan strings to provide reliable testing of the circuitry thereon. Since 200 LSSD latches per scan string is generally considered the limit for practical LSSD testing techniques to be performed, at least five serial scan strings will generally be present on a chip 24 of this example size. In order to enable the selective connection of the pair of lines 50 and 52 to a plurality of serial scan strings 112, 210, etc., the scan gate 78 in the monitor 100 is capable of selectively switching between these several lines. This will be described in greater detail hereinafter in connection with the functional block diagram of the monitor 100 shown in FIG. 3.

Figures 3, 3A:
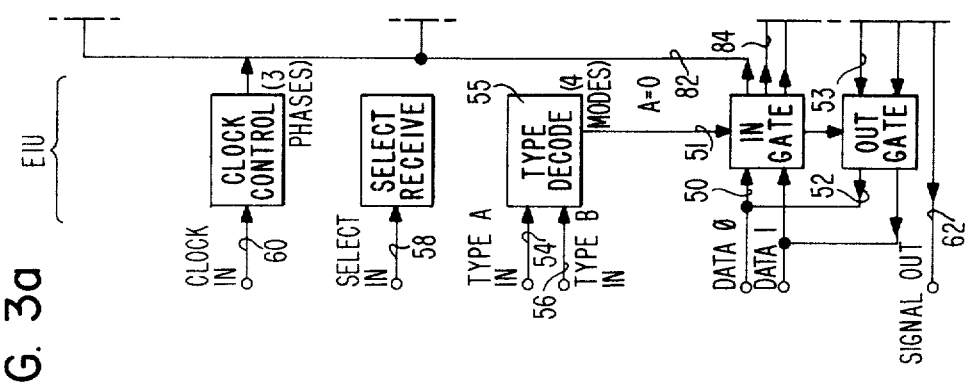
Figure 3B:
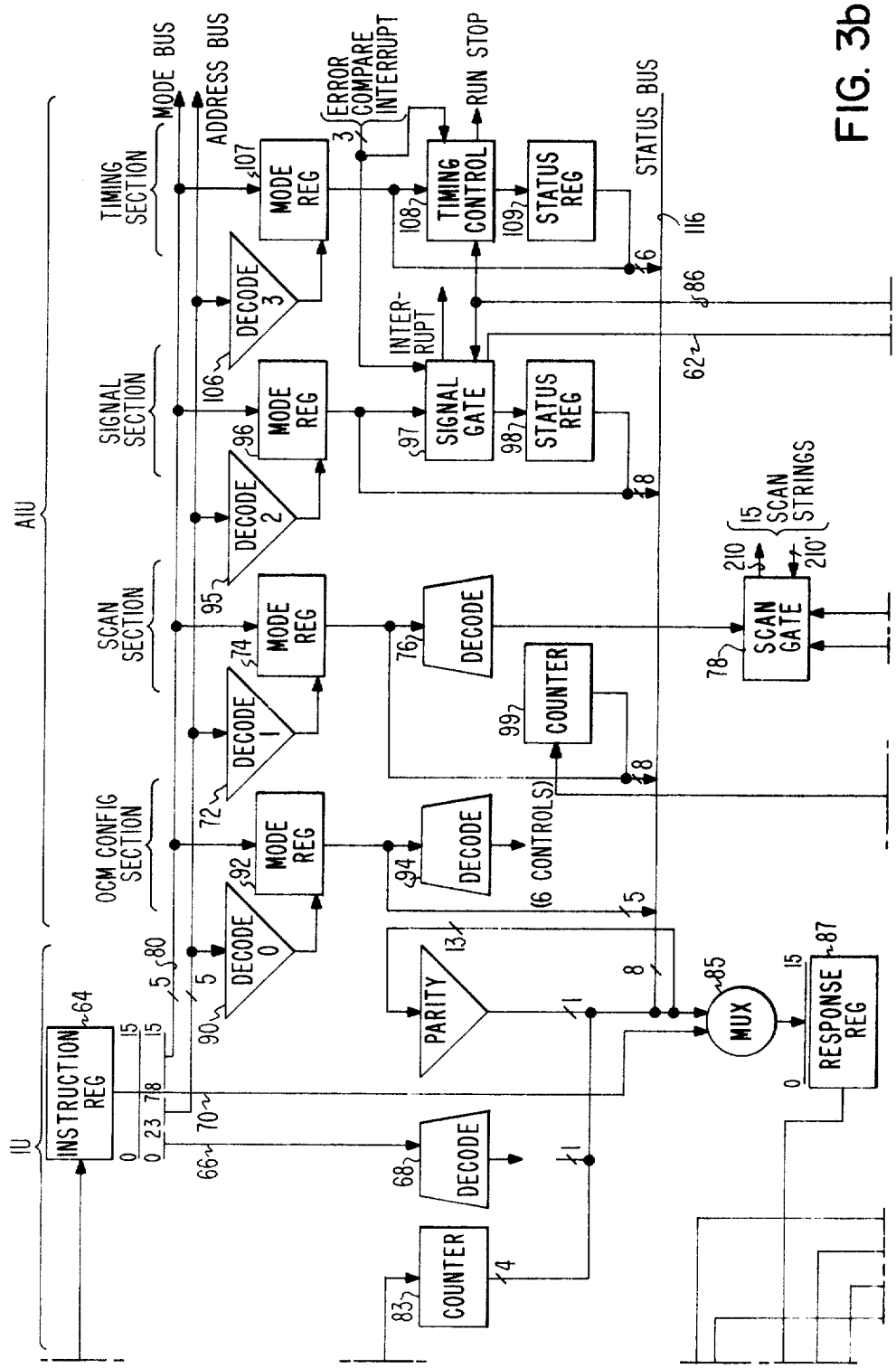

The monitor 100 shown in FIG. 3 has the type A line 54 and the type B line 56 input to the type decoder 55 which has an output to the in gate 51 and the out gate 53. The binary values for the signals on the type A line 54 and the type B line 56 signify which of four types of messages is input on the serial control/test input line 50. When A equals zero and B equals either zero or one, the message input on line 50 is a command. When A equals one and B equals zero, the message input on line 50 is an interrupt. When A equals one and B equals one, the message input on line 50 is scan data.

The in gate 51, in response to the signal from the type decoder 55, will transfer the message input on line 50 to line 82 when the value of A on line 54 is zero. The in gate 51 will transfer the message on line 50 to line 86 when the value of A on line 54 is one and the value of B on line 56 is zero. The in gate 51 will transfer the message on line 50 to line 84 when the value of A equals one on line 54 and the value of B equals one on line 56.

The structure of the monitor 100 in FIG. 3 will be described in connection with its function in carrying out three basically different types of operations, changing the control parameter, performing an LSSD test, and carrying out the reconfiguration of data lines in response to a detected parity error.

CHANGING A CONTROL PARAMETER

In order to change a control parameter in the arithmetic logic of the chip 24, a scan string must be selected which includes the control parameter shift register, the arithmetic operations must be stopped, the new control parameter must be scanned in to the control parameter shift register, and then the arithmetic operations restarted. This is achieved in a six step sequence, as follows.

In a first interval, the signal on the type A line 54 is a binary zero and the signal on the type B line 56 is a binary zero indicating that the message being received on the serial input line 50 is a command. The command message is 16 bits long and is transferred by the in gate over line 82 to the instruction register 64. The command message has three basic fields, bits zero through two constitute an instruction field, bits 3 through 7 constitute an address field, and bits 8 through 15 constitute a mode field. Bits 0 through 2 are input from the instruction register 64 over the line 66 to the decoder 68. Five instructions can be decoded from this field, to load the mode register, to read the status register, to reset the status register, to echo the 16 bits of information in the instruction register 64 through the response register 87 back out onto the output line 52, and a no-op instruction. In this first interval of the example, bits 0 through 2 designate the loading of the mode register.

Bits 3 through 7 of the instruction register 64 constitute an address which is decoded by the decoders 90, 72, 95 and 106 to determine which of the respective mode registers 92, 74, 96 or 107 is to receive the mode bits 8 through 15 on line 80. In the first interval of this example, the address on line 70 is decoded by the decoder 72 to designate the mode register 74 in the scan section of the monitor as the recipient of bits 8 through 15 on line 80. The eight bits loaded into the mode register 74 are decoded by the decoder 76 to select the scan string 210. This selection is carried out by the scan gate 78, which connects the data in line 84 from the in gate 51 to the input line of the scan string 210 and which connects the data out line 88 from the output line 210' of the scan string 210 through the out gate 53 to the output line 52.

During a second interval in this example, with the chip 24 being selected by the select line 58, the type A line 54 has a binary zero and the type B line 56 has a binary zero, thereby designating that the serial message input on the data input line 50 is a command. The command being received is a stop-on-interrupt command which will serve to stop the arithmetic processing on the integrated circuit chip 24 when an interrupt signal is received. This 16-bit command is transferred from the in gate 51 over the line 82 to the instruction register 64. Bits 0 through 2 are decoded by the decoder 68 as an instruction to load the mode register. Bits 3 through 7 are decoded by the decoder 106 to designate the mode register 107 in the timing section of the monitor as the recipient of the information in bits 8 through 15. Bits 8 through 15 are output on line 80 to the mode register 107 as a command indicating that when the next interrupt signal is received, the arithmetic processing on the chip will be stopped by the timing control 108.

During a third interval in this example, when chip 24 is selected by the select line 58, the type A line 54 has a binary one value and the type B line 56 has a binary zero value, indicating that the serial message being received on the data input line 50 is an interrupt signal. The message on line 50 is transferred by the in gate 51 over the line 86 to the timing control 108 which outputs a stop signal to the arithmetic logic blocks on the chip 24, stopping their operation.

During a fourth interval in this example, the type A line 54 has a binary one state and the type B line 56 has a binary one state, designating that the message input on the input line 50 is data. The in gate 51 outputs this message over line 84 to the scan gate 78, which tranfers this data which is a control parameter over the scan line 210 to the control parameter shift register 102 shown in FIG. 2. A reset signal on the chip then causes the parallel output of the control parameter in the shift register 102 to the combinatorial logic block 110, as desired.

During a fifth interval in this example, the type A line 54 has a binary zero state and the type B line 56 has a binary zero state, indicating that the message being received on the data line 50 is a command. The command message is a run message which will restart the arithmetic processing in the arithmetic logic blocks on the integrated circuit chip 24 upon the receipt of the next interrupt signal. The message is transferred from the in gate 51 over the line 82 to the instruction register 64. Bits 0 through 2 are decoded by the decoder 68 to indicate to load the mode register. The decoder 106 decodes the address on line 70 designating the mode register 107 as the recipient of the message on line 80. The run command is loaded in the timing control 108 which will await the next interrupt signal.

During a sixth interval in this example, the type A line 54 has a binary one value and the type B line 56 has a binary zero value, indicating that the message being received on the data line 50 is an interrupt signal. The interrupt signal is routed by the in gate 51 over the line 86 to the timing control 108 which initiates the restarting of the arithmetic operations by the arithmetic logic functions 110 on the integrated circuit chip 24.

In this manner, the LSSD serial scan string 210 on the integrated circuit chip can be employed for changing control parameters governing the logical operation of combinatorial logic functions 110 on the integrated circuit chip. The control parameter shift register 115 which is a part of the second scan string 112 can also be operated in the manner described for the control parameter shift register 102.

Performing an LSSD Test In this example, a level sensitive scan design (LSSD test) will be conducted by having the group controller 22 transfer an input test pattern over a first serial scan string 210 to a first LSSD shift register 104 for input to the logic function block 110 during a first interval and then, after performing a single logic cycle, the results of processing that test pattern are scanned out from a second LSSD shift register 114 over a second serial scan string 112 back to the group controller 22 for test result analysis.

During a first interval of this example, when the select line 58 is on for this integrated circuit chip 24, the type A line 54 has a binary zero state and the type B line 56 has a binary zero state indicating that the message on the input data line 50 is a command, that command being to select the first scan string 210. That command message is transferred by the in gate 51 over the line 82 to the instruction register 64. Bits 8 through 15 of the message are transferred over line 80 to the mode register 74 and are decoded in the decoder 76 to cause the scan gate 78 to connect the scan string 210 to the data in line 84.

During a second interval in this example, the type A line 54 is a binary zero and the type B line 56 is a binary zero indicating that the message input on the data line 50 is a command, it being a stop-on-interrupt command. The command is transferred through the in gate 51 over the line 82 to the instruction register 64. Bits 8 through 15 of the command are transferred over line 80 to the mode register 107 and are input to the timing control 108 indicating that a stop signal is to be issued to the logic block 110 upon the receipt of the next interrupt signal.

In a third interval of this example, when the select line 58 is on, the type A line 54 is a binary one state and the type B line 56 is a binary zero state, indicating that the message being received on the data in line 50 is an interrupt signal. This interrupt signal is transferred from the in gate 51 over the line 86 to the timing control 108 which then issues a stop signal to the logic function 110 on the integrated circuit chip 24.

During a fourth interval of this example, when the select line 58 is on, the type A line 54 has a binary one state and the type B line 56 has a binary one state, indicating that the message being received on the serial data input line 50 is data. This is the test pattern data input from the group controller 22 which is to be scanned through the scan gate 78 over the scan line 210 to the LSSD shift register 104.

During a fifth interval of this example, when the select line 58 is on, the type A line 54 has a binary zero state and the type B line 56 has a binary zero state, indicating that the message being received on the serial data input line 50 is a command, it being a single-cycle-on-interrupt command. This command message is transferred over the line 82 to the instruction register 64 and bits 8 through 15 are transferred over line 80 to the mode register 107 in the timing section of the monitor. This command message is transferred to the timing control 108 so that a single cycle of logic operation will be initiated by the timing control 108 upon the receipt of the next interrupt.

During a sixth interval of this example, when a select signal is received on line 58, the type A input 54 is a binary one state and the type B input on line 56 is a binary zero state, indicating that an interrupt signal is being received on the data line 50. This signal is transferred by the in gate 51 over the line 86 to the timing control 108. The timing control outputs a signal to the logic function 110 causing it to execute a single cycle to perform an arithmetic function on the contents of the LSSD shift register 104 and to output the results of that arithmetic function over line 118 to the output LSSD shift register 114.

During a seventh interval of this example, when the select line 58 is on, the type A line 54 has a binary zero state and the type B line 56 has a binary zero state, indicating that the message input on the serial data line 50 is a command, namely the command to select the scan string 112. This command message is transferred by the in gate 51 over line 82 to the instruction register 64 and bits 8 through 15 of the message are transferred over line 80 to the mode register 74 and are decoded by the decoder 76. The decoder 76 outputs control signals to the scan gate 78 to connect the scan string 112 so that the output line 112' of the scan string 112 is connected to the signal out line 88 from the scan gate 78 to the out gate 53 and thence to the serial data output line 52.

During an eighth interval of this example, when the select line 58 is on, the type A line 54 has a binary one state and the type B line 56 has a binary one state, indicating that data is to be transferred from the scan gate 78 on the data out line 88 through the out gate 53 to the data out line 52. Dummy bits are received on the data input line 50 and are transferred by the in gate 51 over the data in line 84 to the scan gate 78 and are passed through the scan string 112. Instead of dummy bits, the bits input on line 50 could also be test pattern data for a second test to be subsequently performed. The test result bits in the output LSSD shift register 114 are output over line 122 and over the output 112' of the serial scan string 112 through the scan gate 78 and over the data output line 88 to the out gate 53 and thence to the data output line 52. These test result bits are then received by the group controller 22 for subsequent test result analysis.

During a ninth interval in this example, when the select line 58 is on, the type A line 54 has a binary zero state and the type B line 56 has a binary zero state, indicating that the message being received on the serial data input line 50 is a command message and it is the command to restart the arithmetic operations in the logic block 110 upon receipt of the next interrupt. This command is transferred over line 82 to the instruction register 64 and bits 8 through 15 are transferred on line 80 to the mode register 107 which enables the timing control 108 to issue a run signal upon receipt of the next interrupt signal.

During a tenth interval of this example, when the select line 58 is on, the type A line 54 is a binary one and the type B line 56 is a binary zero, indicating that the message being received on the data input line 50 is an interrupt signal. The in gate 51 passes this message over line 86 to the timing control 108. The timing control 108, in response, issues a run signal to the logic function block 110 on the chip 24, thereby restarting the arithmetic operations on the chip. In this manner, LSSD testing operations are performed. The LSSD shift register 204 which is a part of the scan string 210 can also be operated in the manner described for the LSSD shift register 104.

Performing a Reconfiguration in Response to a Detected Parity Error

Figure 4B:
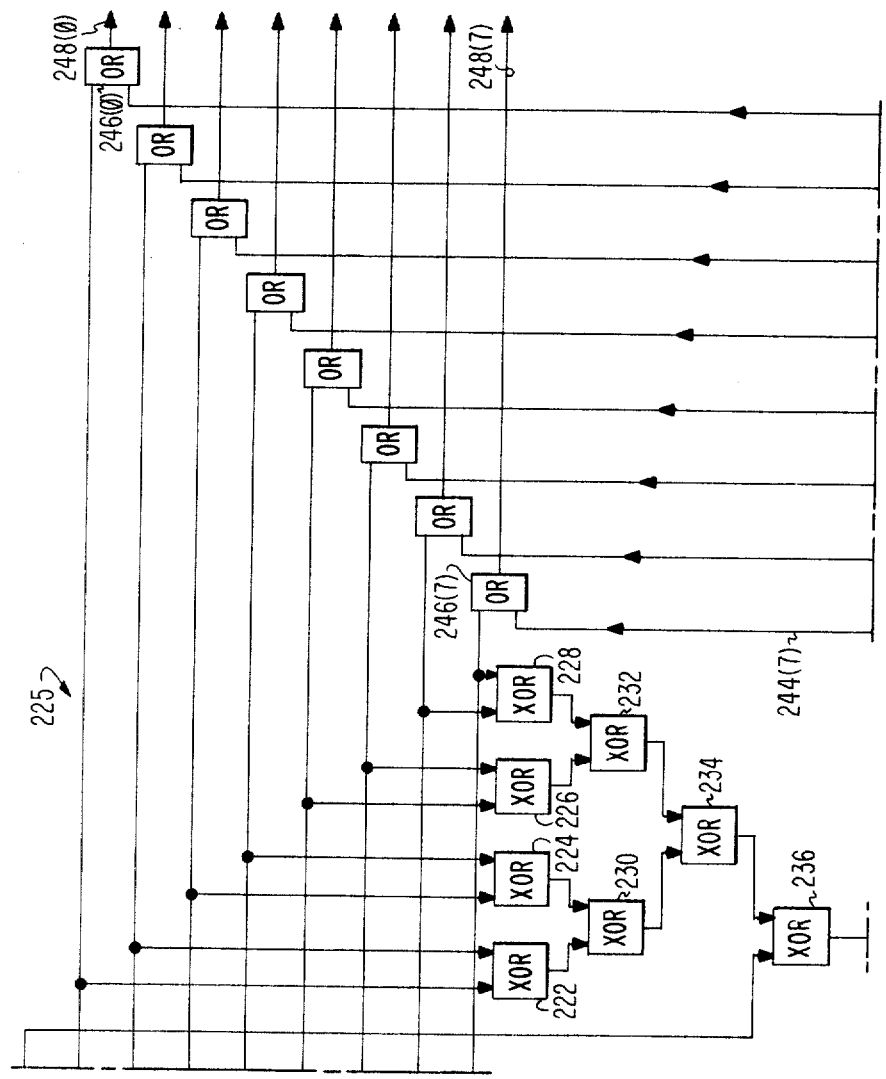
Figure 4C:
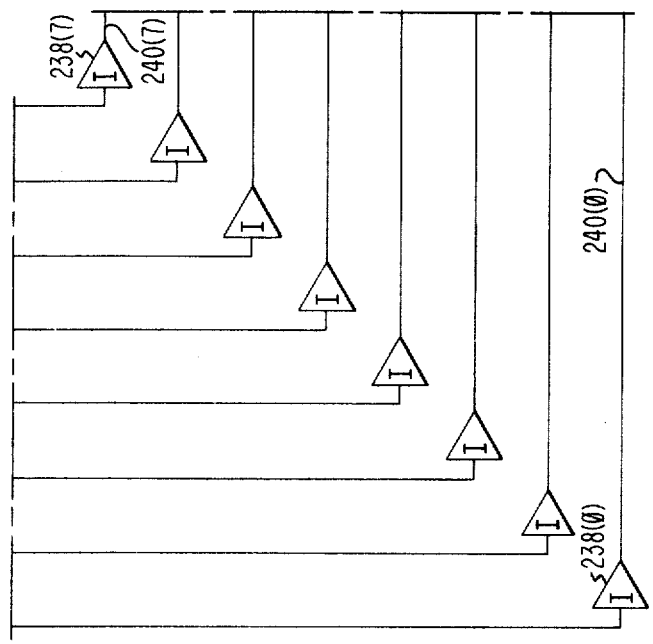
Figure 4D:
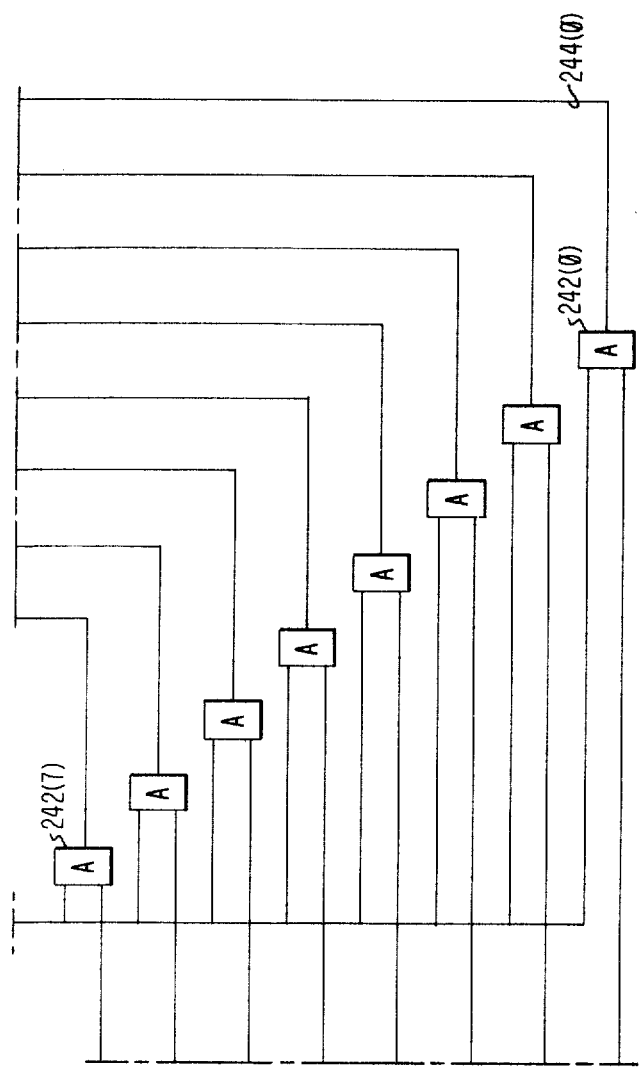

FIG. 4 shows the reconfiguration logic 225 in the interface port 200. The data bus 202 has its lines input to the LSSD shift register 204, and those lines are output from the register 204 through the AND gates 208 to a parity error detector consisting of the exclusive OR gates 222 through 234 which are connected to the data input lines D0 through D7 and the exclusive OR 236 which has an input line connected to the parity line P. The other input to the exclusive OR 236 is the output of the exclusive OR gates 222 through 234. The output from the exclusive OR 236 is the parity error detection signal and will indicate when a parity error has occurred on the data lines D0 through D7 input to the integrated circuit chip 24. When such a parity error is detected, the signal gate 97 outputs a signal on line 62 which passes over the bus 10 to the group controller 22, indicating the existence of a parity error on the chip 24. The group controller 22 will then go through a sequence of tests of the data lines D0 through D7, employing the LSSD testing procedure described above in conjunction with LSSD shift registers 204, 104 and/or 114. When the particular data line D0 through D7 has been identified as the failing line, the group controller 22 will output a reconfiguration message to the chip 24 which is executed in the following sequence of steps.

During a first interval of this example, when the select line 58 is on, the type A line 54 has a binary zero state and the type B line 56 has a binary zero state, indicating that a command message is being received on the serial input data line 50, that message being to select the scan line 210. The in gate 51 conveys the message on line 82 to the instruction register 64 and bits 8 through 15 of the message are transferred to the mode register 74. The mode register 74 outputs the message to the decoder 76 which provides signals to the scan gate 78 for connecting the scan line 210 to the data input line 84.

During a second interval of this example, when the select line 58 is on, the type A line 54 has a binary zero state and the type B line 56 has a binary zero state, indicating that a command message is being received on the serial data input line 50 indicating that the arithmetic block 110 is to stop arithmetic operations upon receipt of the next interrupt. The command message is conveyed from the in gate 51 over the line 82 to the instruction register 64 and bits 8 through 15 are transferred over line 80 to the mode register 107 in the timing section. The timing control 108 receives the message from the mode register 107 and is prepared to stop the arithmetic operations on the integrated circuit chip 24 upon receipt of the next interrupt signal.

During a third interval of this example, when the select line 58 is on, the type A line 54 has a binary one state and the type B line 56 has a binary zero state, indicating the receipt of an interrupt signal on the serial input data line 50. The interrupt signal is transferred from the in gate 51 over line 86 to the timing control 108. The timing control 108 issues a stop signal to the logic block 110 to stop the arithmetic functions on the integrated circuit chip 24.

During a fourth interval in this example, when the select line 58 is on, the type A line 54 has a binary one state and the type B line 56 has a binary one state, indicating that data is being received over the serial data input line 50. That data will be the scan data for reconfiguring the input data lines D0 through D7 by means of the reconfiguration logic 225. The reconfiguration message is transferred from the input data line 50 through the in gate 51 and over the data in line 84 to the scan gate 78 and out onto the scan line 210 which has been selected. The reconfiguration message is serially transferred over the serial scan string 210 through the control parameter shift register 102 and through the LSSD shift register 104 and thence over line 211 to the reconfiguration shift register 212. The reconfiguration message is then transferred in parallel from the reconfiguration shift register 212 to the reconfiguration decoder 216 where it will be active to execute the desired reconfiguration of the data lines D0 through D7, as will be described hereinafter, by means of the reconfiguration logic 225 shown in FIG. 4.

During a fifth interval of this example, when the select line 58 is on, the type A line 54 has a binary zero state and the type B line 56 has a binary zero state, indicating that a command message is being received on the serial input data line 50, that message being a restart message on the next received interrupt signal. The command message is transferred from the in gate 51 over the line 82 to the instruction register 64. Bits 8 through 15 are transferred over line 80 to the mode register 107 in the timing section of the monitor. The timing control 108 receives these bits from the mode register 107 and is set up to restart the running of the arithmetic logic in the logic block 110 on the integrated circuit chip 24 upon receipt of the next interrupt signal.

During the sixth interval of this example, when the select line 58 is on, the type A line 54 has a binary one state and the type B line 56 has a binary zero state, indicating that an interrupt signal is being received on the serial data input line 50. This signal is transferred through the in gate 51 over the line 86 to the timing control 108. In response, the timing control 108 outputs a run signal to the arithmetic logic in the logic block 110, recommencing the operation of the arithmetic functions to be performed on the chip.

In this manner, the LSSD scan strings on the integrated circuit chip 24 can be employed for transferring reconfiguration messages to reconfiguration logic on the integrated circuit chip in response to the detection of parity errors.

Reconfiguration Logic

FIGS. 2 and 4 illustrate the interface port 200 and features the reconfiguration logic 225. A reconfiguration shift register 212 has a serial input 211 which is connected through the LSSD shift register 104 and the control parameter shift register 102 over the scan string 210 to the scan gate 78. The reconfiguration shift register 212 has a parallel output to the reconfiguration decoder 216 and it has a serial output 214 to the serial input of the LSSD shift register 204. The reconfiguration shift register 212 receives reconfiguration bits at the serial input 211 and provides those reconfiguration bits at its parallel output to the decoder 216.

The LSSD shift register 204 in the interface port 200 has its serial input 214 connected to the serial output of the shift register 212, a parallel input for receiving the data bus lines 202 comprising the eight data lines D0 through D7 and the parity line P. The LSSD shift register 204 has a serial output line 210' to the scan gate 78 and the parallel output consisting of the nine lines 206. The LSSD shift register 204 selectively transfers operand data from the input data bus 202 to the parallel output 206 during normal operating intervals or it will alternately transfer test pattern data from the serial input line 214 which is part of the scan string 210, to the parallel output 206 during LSSD testing intervals.

A plurality of nine AND gates 208 (0) through 208 (7) and 208 (P), in FIG. 4, each have their respective first input connected to one of the parallel outputs 206 (0) through 206 (7) or 206 (P) from the LSSD shift register 204. Each of the AND gates 208 has a second input connected to a respective one of nine output lines 218 (0) through 218 (7) and 218 (P) from the reconfiguration decoder 216. Each of the AND gates 208 has a respective one of nine output lines 220 (0) through 220 (7) and 220 (P).

The P line in the input data bus 202 is a parity bit line and the remaining eight lines D0 through D7 are data input lines associated with the parity bit line P.

The eight AND gates 208 (0) through 208 (7) connected through the LSSD shift register 204 to the data input lines D0 through D7, respectively, have their respective output lines 220 (0) through 220 (7) connected to the exclusive OR gates 222, 224, 226 and 228, as is shown in FIG. 4. The exclusive OR gates 222 and 224 have their outputs input to the exclusive OR gate 230. The exclusive OR gates 226 and 228 have their outputs input to the exclusive OR gate 232. The outputs of the exclusive OR gates 230 and 232 are input to the exclusive OR gate 234. The output of the exclusive OR gate 234 is input to the exclusive OR gate 236. The other input to the exclusive OR gate 236 is the line 220 (P) which is connected through the AND gate 208 (P) and a line 206 (P) and through the LSSD shift register 204, to the P line of the input data bus 202. The parity rule to be followed for the data input bus 202 is odd parity so that the total number of binary ones on the nine lines comprising the data bus 202 must be odd. Thus, an even number of binary ones must be present on the data lines D0 through D7 if no parity errors are to be detected, and thus the output of the exclusive OR gate 234 will always be opposite to the parity line 220 (P). Thus, the output of the exclusive OR 236 will always be a binary one if no parity errors are present.

Taking the reverse point of view, if one of the data input lines D0 through D7 is failing and is intentionally set to a binary zero, and if the nine bits of information transmitted over the data bus 202 are all valid and self consistent with the parity line until they are input to the chip 24, then use can be made of this principle by selectively connecting the output of the exclusive OR gate 236 to the isolated, interior segment of the failed data line, thereby reconstituting the validity of the eight bits originally transmitted on the data bus 202. This is achieved by means of the eight AND gates 242 (0) through 242 (7) each of which has a first input connected to the output of the exclusive OR gate 236. Each respective AND gate 242 has a second input connected over a respective one of the eight lines 240 (0) through 240 (7) through a respective one of the eight inverters 238 (0) through 238 (7) to a respective one of eight outputs 218 (0) through 218 (7) from the reconfiguration decoder 216 in FIG. 4. The output of each respective AND gate 242 (0) through 242 (7) is connected over a respective one of the eight lines 244 (0) through 244 (7) to a first input of a respective one of the eight OR gates 246 (0) through 246 (7). The other input of the respective OR gates 246 is connected to the output line 220 (0) through 220 (7) of a respective one of the AND gates 208 (0) through 208 (7), as is shown in FIG. 4. The outputs of the OR gates 246 are the respective, isolated, output lines 248 (0) through 248 (7) which are directed to logic function blocks 110 on the chip 24.

In an example of the operation of the reconfiguration logic 225, assume that the input data line D7 is failing at its input to the chip 24. The group controller 22 inputs a reconfiguration message to the reconfiguration shift register 212, as previously described, which is decoded by the reconfiguration decoder 216 to provide enabling signals on lines 218 (P), and 218 (0) through 218 (6). No enabling signal is output on line 218 (7). Therefore, the AND gate 208 (7) will have its output line 220 (7) at a binary zero value. Since the eight bits of data and the parity bit on the nine lines of the data bus 202 are valid and self consistent until they reach the chip 24, the output of the exclusive OR gate 236 will be the binary value of the failed line D7. The binary zero value on the output line 218 (7) from the reconfiguration decoder 216 will be inverted by the inverter 238 (7) to a binary one value which will enable the AND gate 242 (7), thereby passing the output of the exclusive OR 236 over the line 244 (7) to the input of the OR gate 246 (7). The binary one value on all of the other output lines from the reconfiguration decoder 216 will be inverted by the inverters 238 to thereby disable the corresponding AND gates 242. Thus, the output of the exclusive OR gate 236 which is the binary value of the failed bit line D7 is transferred to the corresponding line 248 (7) while the binary value for the input lines D0 through D6 are passed through to the respective lines 248 (0) through 248 (6), so as to fully reconstitute the validity of the eight bits of data which are to be transmitted to the combinatorial logic functions on the integrated circuit chip 24.

In this manner, a serial reconfiguration message received from the group controller 22 by the chip 24 on line 50 can be conveyed over the serial scan string 210 to the reconfiguration shift register 212 to carry out the reconfiguration of a failing bit line from the input data bus 202, in response to a detected parity error.

Although a specific embodiment of the invention has been disclosed it will be understood by those of skill in the art that the foregoing and other changes in form and details may be made therein without departing from the spirit and the scope of the invention.

Having thus described our invention, what we claim as new, and desire to secure by Letters Patent is:

1. In an integrated digital logic circuit chip having an LSSD serial input line, an LSSD serial output line, N digital input lines and a logic block thereon, comprising:
   a control parameter shift register having a serial input connected to said LSSD serial input line, a parallel output connected to a control input of said logic block, and a serial output, for providing control parameters to said logic block during a first interval;
   an LSSD shift register having a parallel input connected to said N digital input lines, a serial input connected to said serial output of said control parameter shift register, and a parallel output connected to a data input of said logic block, for selectively transferring operand data from said N digital input lines to said data input of said logic block during a second interval or alternately for transferring test data from said serial input line to said data input of said logic block during a third interval;

whereby a single LSSD scan string can be used for both control functions and testing functions.

2. In an integrated digital logic circuit chip having an LSSD serial input line, an LSSD serial output line, N digital input lines and a logic block thereon, comprising:

an LSSD shift register having a parallel input connected to the output of said logic block, a serial input connected to said serial input line and a parallel output and a serial output line, for selectively transferring operand data from said logic block to said parallel output during a first interval or alternately for transferring test data from said logic block to said serial output line during a second interval;

a control parameter shift register having a serial input connected to said serial output of said LSSD shift register, a parallel output connected to a control input of said logic block, and a serial output connected to said LSSD serial output line, for providing control parameters to said logic block during a third interval;

whereby a single LSSD scan string can be used for both control functions and testing functions.

3. An integrated digital logic circuit chip having an LSSD serial input line, an LSSD serial output line, comprising:

an LSSD shift register having a parallel input connected to said N digital input lines, a serial input, a serial output connected to said LSSD serial output line, and a parallel output, for selectively transferring operand data from said N digital input lines to said parallel output thereof during a first interval or alternately for transferring test data from said serial input to said parallel output thereof during a second interval;

reconfiguration logic having a parallel input connected to said parallel output of said LSSD shift register, for selectively reconfiguring the data bits input on said N digital input lines;

a reconfiguration shift register having a serial input connected to said LSSD serial input line, a parallel output, and a serial output connected to said serial input of said LSSD shift register, for providing reconfiguration bits at said parallel output thereof during a third interval;

a reconfiguration decoder having a parallel input connected to said parallel output of said reconfiguration shift register and a control output connected to a control input of said reconfiguration logic for providing a control signal to said reconfiguration logic in response to reconfiguration bits input from said reconfiguration shift register which have been provided to said serial input thereof from said serial input line during said third interval;

whereby a single LSSD scan string can be used for both data path reconfiguration functions and testing functions.

4. In an integrated digital logic circuit chip having an LSSD serial input line, an LSSD serial output line, N digital input lines and a logic block thereon, comprising:

a reconfiguration shift register having a serial input connected to said serial input line, a parallel output, and a serial output, for receiving reconfiguration bits at said serial input thereof and providing said reconfiguration bits at said parallel output thereof;

an LSSD shift register having a serial input connected to said serial output of said reconfiguration shift register, a parallel input connected to said N digital input lines, a serial output connected to said LSSD serial output line and a parallel output, for selectively transferring operand data from said N digital input lines to said parallel output thereof or alternately for transferring test data from said serial input line to said parallel output thereof;

a plurality of first AND gates, each having a first input connected to one of said N output lines from said LSSD shift register, and each having a second input connected to a respective one of N output lines from said reconfiguration decoder, each said AND gate having an output line;

one of said N digital input lines being a parity bit line, the remaining N−1 of said N digital input lines being data input lines associated with said parity bit input line;

a subplurality of N−1 of said N first AND gates having their inputs respectively connected to said N−1 data input lines, having their respective output lines connected to a first exclusive OR circuit and the output from the remaining one of said N first AND gates whose input is connected to said parity bit input line, having its respective output line connected to the input of a second exclusive OR gate, the second input to said second exclusive OR gate being connected to the output of said first exclusive OR gate;

a plurality of N−1 second AND gates each having a respective first input connected to the output of said second exclusive OR gate and a second respective input thereof connected through a respective inverter circuit to respective ones of said subplurality of N−1 input lines to said respective subplurality of N−1 first AND gates;

a plurality of N−1 OR gates each having a respective first input connected to said respective output of one of said subplurality of N−1 first AND gates, and a second respective input connected to an output of one of said plurality of N−1 second AND gates and a plurality of N−1 circuit output lines input to said logic block;

said reconfiguration decoder enabling said first AND gates during normal operating conditions, to pass the signals input on said N−1 subplurality of said N digital input lines through said OR gates to said circuit output lines;

said reconfiguration decoder disabling a selected one of said first AND gates in response to reconfiguration bits received from said reconfiguration shift register and providing an enabling signal on a corresponding one of said N−1 input lines to one of said N−1 second AND gates, thereby enabling the output of said second exclusive OR gate, to be transmitted through the corresponding connected one of said N−1 OR gates to a corresponding one of said N−1 circuit output lines under conditions where a corresponding one of said N−1 data lines of said N digital input lines is defective;

whereby the information contained in said parity line and said N−1 bits of data in said N digital input lines may be passed to said circuit output lines and to said logic block when one of said N−1 data input lines is defective.

5. In an integrated digital logic circuit chip having a serial input line, a serial output line, N digital input lines and a logic block thereon, the improvement comprising:

a type decoder having an input connected to a type designating input line, for decoding the type of message being received on said serial input line;

an input gate having a data input connected to said serial input line and a control input connected to an output from said type decoder, for directing the serial data input on said serial input line to one of a first, a second, or a third outputs thereof;

an instruction register having an input connected to said first output of said input gate, for receiving the serial data input on said serial input line in response to a first type signal input to said type decoder;

a scan gate having an input connected to said second output of said input gate, for receiving data input on said serial input line in response to a second type signal input to said type decoder;

a timing control having a first input connected to said third output of said input gate, for receiving data input on said serial input line in response to a third type signal input to said type decoder;

said timing control having a second input selectively connected to an output of said instruction register, for receiving run commands input from said serial input line, and having an output connected to said logic block, for controlling the running and stopping of arithmetic operations performed by said logic block in response to said run commands;

said scan gate having a control input for selectively connecting said second output of said input gate to one of a plurality of LSSD scan strings connected to said logic block;

a first mode register having an input connected to an output of said instruction register and an output connected to said control input of said scan gate, for receiving scan string selection commands from said serial input line for selecting which one of said plurality of scan strings will be connected to said second output of said input gate;

said input gate transferring a scan string select command to said instruction register for transmission through said first mode register to said scan gate, for connecting a selected one of said plurality of scan strings to said second output of said input gate;

said input gate transferring a stop command through said instruction register to said timing control for stopping the arithmetic operations of said logic block when a next interrupt signal is received;

said input gate transferring an interrupt signal from said serial input line via said third output thereof to said first timing control, for initiating the stopping of said arithmetic operations of said logic block;

said input gate transferring serial data from said serial input line out of said second output thereof to said input of said scan gate, for transfer over said selected one of said plurality of scan strings to said logic block.

6. The apparatus of claim 5 wherein said serial data transferred to said logic block over said selected one of said scan strings is LSSD test pattern data.

7. The apparatus of claim 5 wherein said serial data transferred over said selected one of said plurality of scan strings to said logic block is control parameter data.

8. The apparatus of claim 5 wherein said serial data transferred by said scan gate over said selected one of said scan strings to said logic block is data path reconfiguration data.

9. In an integrated digital logic circuit chip having a serial input line, a serial output line, N digital input lines and a logic block thereon, the improvement comprising:

a type decoder having an input connected to a type designating input line, for decoding the type of message being received on said serial input line;

an input gate having a data input connected to said serial input line and a control input connected to an output from said type decoder, for directing the serial data input on said serial input line to one of a first or a second outputs thereof;

an instruction register having an input connected to said first output of said input gate, for receiving the serial data input on said serial input line in response to a first type signal input to said type decoder;

a scan gate having an input connected to said second output of said input gate, for receiving data input on said serial input line in response to a second type signal input to said type decoder;

a controller having an input selectively connected to an output of said instruction register, for receiving commands input from said serial input line, and having an output connected to said logic block, for controlling the operations performed by said logic block in response to said commands;

said scan gate having a control input for selectively connecting said second output of said input gate to one of a plurality of LSSD scan strings connected to said logic block;

a mode register having an input connected to an output of said instruction register and an output connected to said control input of said scan gate, for receiving scan string selection commands from said serial input line for selecting which one of said plurality of scan strings will be connected to said second output of said input gate;

said input gate transferring a scan string select command to said instruction register for transmission through said mode register to said scan gate in response to said first type signal, for connecting a selected one of said plurality of scan strings to said second output of said input gate;

said input gate transferring a command through said instruction register to said controller in response to said first type signal, for controlling the operations of said logic block;

said input gate transferring serial data from said serial input line out of said second output thereof to said input of said scan gate in response to said second type signal, for transfer over said selected one of said plurality of scan strings to said logic block.

10. In an integrated digital logic circuit chip having a serial input line, a serial output line, N digital input lines and a logic block thereon, the improvement comprising:

a type decoder having an input connected to a type designating input line, for decoding the type of message being received on said serial input line;

an input gate having a data input connected to said serial input line and a control input connected to an output from said type decoder, for directing the serial data input on said serial input line to one of a first or a second outputs thereof;

an instruction register having an input connected to said first output of said input gate, for receiving the serial data input on said serial input line in response to a first type signal input to said type decoder;

a scan gate having an input connected to said second output of said input gate, for receiving data input on said serial input line in response to a second type signal input to said type decoder;

a first scan string having an input connected to a first output of said scan gate and including a first serially connected shift register with a parallel output to said logic block, for receiving commands input from said serial input line for controlling the operations performed by said logic block;

a second scan string having an input connected to a second output of said scan gate and including an LSSD shift register with a parallel output to said logic block, for receiving test data from said serial input line for testing said logic block;

said scan gate having a control input for selectively connecting said second output of said input gate to said first or said second LSSD scan strings connected to said logic block;

a mode register having an input connected to an output of said instruction register and an output connected to said control input of said scan gate, for receiving scan string selection commands from said serial input line for selecting which one of said first or second scan strings will be connected to said second output of said input gate;

said input gate transferring a scan string select command to said instruction register for transmission through said mode register to said scan gate in response to said first type signal, for connecting a selected one of said first or second scan strings to said second output of said input gate;

said input gate transferring serial data from said serial input line out of said second output thereof to said input of said scan gate in response to said second type signal, for transfer over said selected one of said first or second scan strings to said logic block.

* * * * *